(12) United States Patent
Gates et al.

(10) Patent No.: US 9,927,702 B2
(45) Date of Patent: Mar. 27, 2018

(54) SEMI-SUBMERSIBLE MICROSCOPE OBJECTIVE WITH PROTECTIVE ELEMENT AND USE OF THE SAME IN MULTIPHOTON IMAGING METHOD

(71) Applicant: 3M INNOVATIVE PROPERTIES COMPANY, St. Paul, MN (US)

(72) Inventors: Brian J. Gates, Osceola, WI (US); Robert J. DeVoe, Minnetonka, MN (US); Tzu-Chen Lee, Woodbury, MN (US); Bradford B. Wright, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 47 days.

(21) Appl. No.: 15/100,552

(22) PCT Filed: Dec. 1, 2014

(86) PCT No.: PCT/US2014/067958
§ 371 (c)(1),
(2) Date: May 31, 2016

(87) PCT Pub. No.: WO2015/084737
PCT Pub. Date: Jun. 11, 2015

(65) Prior Publication Data
US 2016/0299426 A1    Oct. 13, 2016

Related U.S. Application Data

(60) Provisional application No. 61/912,748, filed on Dec. 6, 2013.

(51) Int. Cl.
| | | |
|---|---|---|
| *G03F 7/20* | (2006.01) | |
| *G03F 7/00* | (2006.01) | |
| *G02B 21/02* | (2006.01) | |
| *G02B 21/33* | (2006.01) | |
| *G02B 1/14* | (2015.01) | |
| *G02B 1/04* | (2006.01) | |
| *G02B 7/02* | (2006.01) | |
| *G03F 7/32* | (2006.01) | |

(52) U.S. Cl.
CPC ............ *G03F 7/0005* (2013.01); *G02B 1/04* (2013.01); *G02B 1/14* (2015.01); *G02B 7/02* (2013.01); *G02B 21/02* (2013.01); *G02B 21/33* (2013.01); *G03F 7/2053* (2013.01); *G03F 7/32* (2013.01); *G02B 2207/114* (2013.01); *G03F 7/70983* (2013.01)

(58) Field of Classification Search
CPC ............ G03F 7/2053; G03F 7/70375; G03F 7/70416; G03F 7/70983; G02B 21/02; G02B 21/33; G02B 1/14; G02B 1/105

USPC ......................................................... 430/322
See application file for complete search history.

(56) References Cited

U.S. PATENT DOCUMENTS

| | | |
|---|---|---|
| 3,087,920 A | 4/1963 | Suzumura |
| 6,250,512 B1 | 6/2001 | Salamon |
| 6,403,966 B1 | 6/2002 | Oka |
| 7,118,845 B2 | 10/2006 | DeVoe |
| 7,265,161 B2 | 9/2007 | Leatherdale |
| 8,276,756 B2 | 10/2012 | Denome |
| 2004/0210025 A1 | 10/2004 | Hinde |
| 2005/0225737 A1* | 10/2005 | Weissenrieder .... G03F 7/70341 355/53 |
| 2006/0187430 A1 | 8/2006 | Dodoc |
| 2012/0098164 A1* | 4/2012 | Kan ...................... B29C 64/135 264/494 |
| 2012/0164424 A1 | 6/2012 | Vicari |
| 2012/0218535 A1 | 8/2012 | Thiel |
| 2013/0183833 A1 | 7/2013 | Duan |
| 2016/0306277 A1 | 10/2016 | Lee |

FOREIGN PATENT DOCUMENTS

CN         2519297 Y       10/2002

OTHER PUBLICATIONS

Lee, "Recent developments in the use of two-photon polymerization in precise 2D and 3D microfabrications", Polymers for Advanced Technologies, Feb. 2006, vol. 17, pp. 72-82.
Nanoscribe, "Dip-In Laser Lithography", Data sheet, 1 pg. Applicant stipulates date prior to Dec. 6, 2012.
Verschuren, "High-Density Near-Field Recording on Cover-Layer Protected Discs Using an Actuated 1.45 Numerical Aperture Solid Immersion Lens in a Robust and Practical System", Japanese Journal of Applied Physics, 2007, vol. 46, No. 6B, pp. 3889-3893.
Verschuren, "Towards Cover-Layer Incident Read-Out of a Dual-layer Disc with a NA=1:5 Solid Immersion Lens", Japanese Journal of Applied Physics, 2005, vol. 44, No. 5B, pp. 3554-3558.
Yoon, "Cover-layer-protected solid immersion lens-based near-field recording with an annular aperture," Journal of the Optical Society of America A., Aug. 2009, vol. 26, No. 8, pp. 1882-1888.
International Search Report for PCT International Application No. PCT/US2014/067958, dated Jun. 9, 2015, 7pgs.

* cited by examiner

*Primary Examiner* — John A McPherson
(74) *Attorney, Agent, or Firm* — Bradford B. Wright

(57) ABSTRACT

A semi-submersible microscope objective (100) includes a microscope objective having a protective barrel (120) with an optical inlet (122) and optical outlet (124), and a protective element (130) affixed to the microscope objective, sealing the optical outlet (124) but not the optical inlet (122). A transparent portion (132) of the protective element is aligned with the optical exit (124). The protective element is separable from the microscope objective without damaging the microscope objective. Use of the semi-submersible microscope objective in a multiphoton imaging method is also disclosed.

8 Claims, 3 Drawing Sheets

SEMI-SUBMERSIBLE MICROSCOPE OBJECTIVE WITH PROTECTIVE ELEMENT AND USE OF THE SAME IN MULTIPHOTON IMAGING METHOD

TECHNICAL FIELD

The present disclosure broadly relates to microscope objectives and their use in multiphoton imaging methods.

BACKGROUND

In a microscope, the objective (sometimes referred to in the art as an objective lens) is the optical element that gathers light from the object being observed and focuses the light rays to produce a real image. For example, the objective lens of a microscope is the one at the bottom near the sample. At its simplest, it is a very high-powered magnifying glass, with very short focal length. This is brought very close to the specimen being examined so that the light from the specimen comes to a focus inside the microscope tube. The microscope objective itself is typically substantially cylindrical or tubular and contains one or more lenses, typically made of glass, confined within a protective barrel. Microscope objectives generally have an optical inlet and optical exit, typically centered along opposite ends of its longitudinal axis. The optical inlet and optical exit are connected by an optical path extending between them through the microscope objective.

Microscope objectives are typically characterized by two parameters: magnification and numerical aperture. The former typically ranges from 4×-100×, while the latter ranges from about 0.1 to 1.4, and focal lengths of about 30 millimeters to about 200 microns, respectively. Similarly, microscope objectives with numerical apertures in the range of about 0.1 to 1.4 typically have respective working distances (i.e., the distance between the microscope objective and the focal point where imaging occurs) of from several millimeters to about 210 microns. Similarly, for high magnification applications, an oil-immersion objective or water-immersion objective generally has to be used. The objective is specially designed to use refractive index matching oil or water to fill the air gap between the front element and the object to allow the numerical aperture to exceed 1, and hence give greater resolution at high magnification. Numerical apertures as high as 1.5 or even higher can be achieved with oil immersion. Microscope objectives with high numerical aperture (NA) and of high quality are typically quite expensive.

Microscope objectives are also used to focus laser light in a process known as multiphoton stereolithography. In that process, laser light (typically in the infrared) is focused in a polymerizable composition commonly termed a "photoresist", typically supported on a substrate. The photoresist contains a multiphoton absorbing compound, and the laser has sufficiently high power that two (or, less typically, more than two) photons are absorbed essentially simultaneously by the multiphoton absorbing compound resulting in subsequent polymerization of the photoresist.

In order to improve resolution, one conventional approach has been to partially submerge the objective lens assembly into a liquid photoresist to eliminate the air interface/objective lens interface. However, the localized laser power in multiphoton stereolithography can be considerable, and the potential exists for a buildup of polymerized photoresist material over time on the microscope objective lens that could be difficult to remove from the optical surfaces. Were this to happen, there is a potential that an expensive microscope objective could be rendered unusable.

SUMMARY

In one aspect the present disclosure provides a semi-submersible microscope objective comprising:
a microscope objective having a protective barrel with an optical inlet and optical outlet;
a protective element affixed to the microscope objective, sealing the optical exit but not the optical inlet, wherein a transparent portion of the protective element is aligned with the optical exit, and wherein the protective element is separable from the microscope objective without damaging to the microscope objective.

In another aspect, the present disclosure provides a multiphoton imaging method comprising:
immersing a semi-submersible microscope objective in a liquid photoresist comprising a multiphoton absorber and a polymerizable compound, wherein the semi-submersible microscope objective comprises:
 a microscope objective having a protective barrel with an optical inlet and optical outlet;
 a protective element affixed to the microscope objective, sealing the optical exit but not the optical inlet, wherein a transparent portion of the protective element is aligned with the optical exit, and wherein the protective element is separable from the microscope objective substantially without damaging the microscope objective;
directing laser light through the semi-submersible microscope objective and into liquid photoresist in an image-wise manner under conditions such that multiphoton absorption by the multiphoton absorber occurs, and at least partial polymerization of the polymerizable compound occurs resulting in an exposed photoresist; and
developing the exposed photoresist.

Advantageously, semi-submersible objective lens assemblies according to the present disclosure can be partially submerged in liquid photoresists during multiphoton imaging processes, and even in the event that the polymerizable compound were to polymerize and cause residue buildup on the microscope objective, relatively mild chemical treatment and/or simple mechanical disengagement can be used to dislodge it from the exposed (and polymerized) photoresist.

As used herein:
"light" means electromagnetic radiation having a wavelength in a range of from about 300 to about 1500 nm;
"liquid" refers to a compound that is in a liquid state at one atmosphere of pressure and at least one temperature in the range of from 20-25° C., inclusive;
"multiphoton absorption" means the simultaneous absorption of two or more photons of light to reach a photoreactive, electronic excited state that is energetically inaccessible by the absorption of a single photon of the same energy;
"multiphoton absorber" means a specie capable of undergoing multiphoton absorption of light;
"numeric aperture" means the product of the index of refraction of the object medium multiplied by the sine of the slope angle of the outermost ray from an axial point on the object;
"optical entrance" refers to the end of a microscope objective where the light beam has parallel light rays;
"optical exit" refers to the end of a microscope objective where the light beam converges;

"photochemically effective amount" means an amount sufficient to enable the photoreactive species to undergo at least partial reaction under the selected exposure conditions (as evidenced, e.g., by a change in density, viscosity, color, pH, refractive index, or other physical or chemical property);

"simultaneous" means two events that occur within the period of $10^{-14}$ seconds or less; and "solvent" refers to a nonreactive liquid component of a composition that dissolves at least one solid component, or dilutes at least one liquid component, of the composition (in the case of water, adventitious amounts of water are not included by the term "solvent"); and "solvent developing" means substantially removing (e.g., dissolving) soluble material in a solvent while substantially not removing insoluble material.

Features and advantages of the present disclosure will be further understood upon consideration of the detailed description as well as the appended claims.

Figure 1:
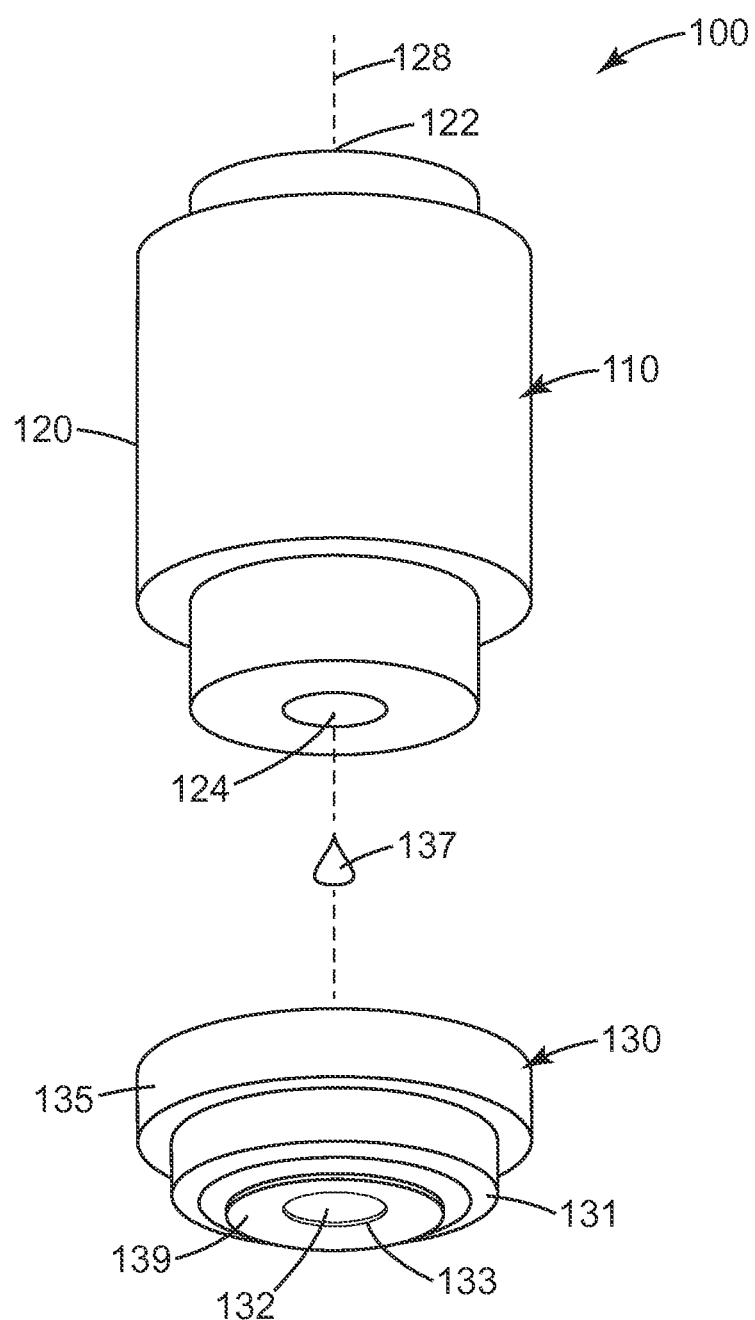
FIG. 1 is a schematic exploded perspective view of exemplary semi-submersible microscope objective 100.

Repeated use of reference characters in the specification and drawings is intended to represent the same or analogous features or elements of the disclosure. It should be understood that numerous other modifications and embodiments can be devised by those skilled in the art, which fall within the scope and spirit of the principles of the disclosure. The figures may not be drawn to scale.

DETAILED DESCRIPTION

The semi-submersible microscope objective can be made by modifying a conventional microscope objective. For use in multiphoton imaging processes using liquid photoresists, the numerical aperture (NA) is preferably at least 1.0, more preferably at least 1.2, and more preferably at least 1.4, although other numerical apertures may be used, if desired. Objective numerical aperture can be dramatically increased by designing the objective to be used with an immersion medium, such as oil, glycerin, or water.

Microscope objectives (also known as microscope objective lenses) are well-known in the art and are commercially available from numerous sources including, for example: Carl Zeiss Microscopy, LLC, Thornwood, N.Y. (e.g., microscope objectives marketed as OBJECTIVE ALPHA PLAN-APOCHROMAT 100×/1.46 OIL DIC M27, OBJECTIVE ANTIFLEX EC PLAN-NEOFLUAR 63×/1.25 OIL PH3 M27, OBJECTIVE ALPHA PLAN-APOCHROMAT 100×/1.57 OIL-HI DIC CORR M27, ZEISS 40×/1.0 OIL IRIS MICROSCOPE OBJECTIVE (NA=1.0) and OBJECTIVE ALPHA PLAN-APOCHROMAT 100×/1.46 OIL IRIS M27); Nikon Instruments Inc., Melville, N.Y. (e.g., microscope objectives marketed as PLAN 100× W (NA=1.1), CFI S FLUOR 40× OIL (NA=1.30), and CFI S FLUOR 100× OIL (NA=0.5-1.3)); and Olympus Corp., Tokyo, Japan (e.g., microscope objectives marketed as M PLAN APOCHROMAT MPLAPON100XO (NA=1.4)).

Advantageously, the present disclosure is especially useful for expensive microscope objective such as, for example, those designed for immersion in oil or water and/or having a numerical aperture (NA) of at least 0.3, at least 0.4, at least 0.5, at least 0.6, at least 0.7, at least 0.8, at least 0.9, at least 1.0, at least 1.1, at least 1.2, at least 1.3, or even at least 1.4. In some embodiments, the microscope objective has a numerical aperture in a range of from 0.65 to 1.25.

Referring now to FIG. 1, in one embodiment, semi-submersible microscope objective 100 comprises microscope objective 110 and protective element 130. Microscope objective 110 comprises protective barrel 120, optical inlet 122, and optical outlet 124 from which laser light emerges from the microscope objective during multiphoton stereolithography. Optical inlet 122 and optical outlet 124 are aligned with centrally disposed longitudinal axis 128. Protective element 130 is affixed to microscope objective 110 such that it seals optical outlet 124 but not optical inlet 122. Protective element 130 includes transparent portion 132, which is aligned with optical outlet 124.

Figure 2A:
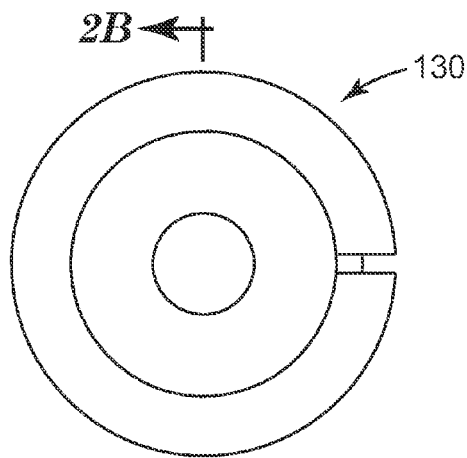
FIG. 2A is a schematic perspective view of protective element 130.
Figure 2B:
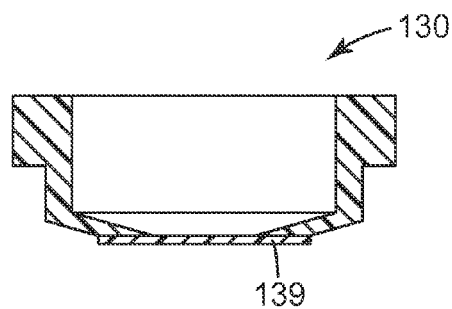
FIG. 2B is a schematic top view of protective element 130.
Figure 2C:
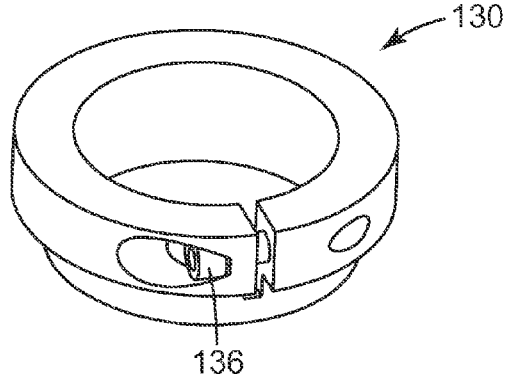
FIG. 2C is a schematic perspective view cross-sectional view of protective element 130.

In the embodiment shown, protective element 130 comprises cap 131 having central opening 133 and sleeve portion 135 extending from cap 131. Sleeve portion 135 is adapted to mechanically engage protective barrel 120 of microscope objective 110. Transparent portion 132 comprises glass cover slip 139 secured to cap 131 (e.g., by adhesive or mechanically), which forms a seal protecting the optical outlet from contact with the liquid photoresist during use. Glass cover slip 139 covers central opening 133 and is adhered to cap 131. The cap and sleeve portions are shown in greater detail in FIG. 1 as being parts of a monolithic protective element; however, they may comprise separate pieces that are assembled to form part, or all, of the protective element. Further details concerning protective element 130 are shown in FIGS. 2A-2C.

The protective element may be constructed of any suitable material(s) including, for example: plastic (e.g., polycarbonate, polyimide, polyetherimide (PEI), polyether ether ketone (PEEK), polyester, polyamide, polyurethane, polyolefin (e.g., low molecular weight polyethylene, high density polyethylene (HDPE), ultrahigh molecular weight polyethylene (UHMWPE), or polypropylene), or polyacetal (e.g., polyoxymethylene); metal; glass; sapphire; quartz; or a combination thereof.

Transparent portion 132 may comprise or consist of any transparent material including, for example, glass, quartz, sapphire, plastic, or a combination thereof. While depicted as forming a raised cover over the central opening, in may also be disposed flush with the cap or even be recessed within it or disposed on its interior.

Protective element 130 mechanically engages microscope objective 110, and is reversibly affixed to microscope objective 110 using tightening screw 136 (see FIG. 2C) which clamps sleeve portion 135 onto protective barrel 120. Accordingly, protective element 130 is separable from microscope objective 110 without damaging microscope objective 110.

Index-matched fluid 137 (e.g., oil) is disposed between optical outlet 124 and glass cover slip 139, thereby eliminating reflections at the inside surface of cover slip 139.

The protective element is affixed to the microscope objective in a removable manner. That is, it can be separated from the microscope objective substantially without damaging the microscope objective. Suitable mechanical means for affixing the protective element to the microscope objective include, for example, clamps (e.g., as shown in FIG. 1), press fit, repositionable adhesive, and interlocking mechanical fasteners (e.g., hook and loop fasteners or capped stem fasteners).

Figure 3:
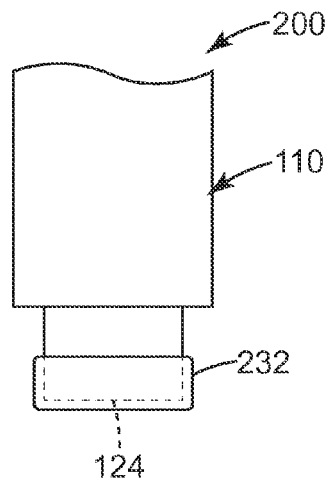
FIG. 3 is a schematic side view of exemplary semi-submersible microscope objective 200.

In another embodiment, shown in FIG. 3, semi-submersible protective element 200 comprises microscope objective 110 having a transparent protective coating 232 disposed on a portion thereof. The transparent protective coating covers and seals optical outlet 124 from contact with a liquid photoresist. To facilitate easy removal without damaging the microscope objective, the transparent protective coating 232 is dissolvable in a water-based solvent, preferably having a pH in a range of from 2 to 16, more preferably from 4 to 10, and even more preferably from 5 to 9.

Preferably, the transparent protective coating comprises a water-soluble polymer Exemplary water-soluble polymers include cold-water-soluble and hot-water-soluble polyvinyl alcohols (preferably cold-water-soluble versions), and water-soluble polymers having pendant carboxyl or carboxylate groups (e.g., especially those derived from copolymers of monomers including acrylic acid, methacrylic acid and/or succinic anhydride). In some embodiments the transparent protective coating may be chemically and/or physically crosslinked. For example, the transparent protective coating may comprise a metal ion-crosslinked acrylic polymer of the type used in commercial vinyl tile floor finishes (e.g., zinc cross-linked acrylic polymer based floor finishes). The metal crosslinks between acrylic acid or methacrylic acid residues in this type of floor finish are reversible using aqueous strippers. Aqueous strippers often have an alkaline pH and contain a soluble or coupled amine (e.g., ethanolamine) that complexes with the metal (e.g., zinc ion). Metal-free floor finishes are also suitable for use as the transparent protective coating as they can likewise be readily removed using an aqueous stripper, optionally with mild rubbing. Water-soluble materials that can be used to form the transparent protective coating include polyvinyl alcohol based materials such as, for example, a 6000 grams/mole, 80 percent hydrolyzed polyvinyl alcohol, available as Cat. No. 2225 from Polysciences, Inc., Warrington, Pa., and those polyvinyl alcohol based materials described in U.S. Pat. No. 3,087,920 (Suzumura et al.) and U.S. Pat. No. 8,276,756 (Denome et al.); polyurethanes as described in U.S. Pat. Appl. Pub. No. 2004/0210025 (Hinde et al); and cold water-soluble polyvinyl alcohol/alkyl acrylate copolymers as disclosed in U.S. Pat. Appl. Pub. No. 2012/0164424.

Floor finish compositions that are strippable using an aqueous stripper may also be used. Suitable floor finish compositions include those containing polyvalent metal ion (e.g., zinc-based floor finishes) that develop chemical crosslinks (e.g., covalent and/or ionic crosslinks) upon drying, and zinc-free floor finish compositions. Examples of suitable commercial zinc-free floor finishes and sealers include those available as SCOTCHGARD UHS 25 FLOOR FINISH, SCOTCHGARD LOW MAINTENANCE 25 FLOOR FINISH, SCOTCHGARD LOW MAINTENANCE 18 FLOOR FINISH, and 3M CORNERSTONE FLOOR SEALER/FINISH from 3M Company, Saint Paul, Minn. Examples of suitable strippers include that available as 3M FLOOR STRIPPER and 3M TROUBLESHOOTER LIQUID FINISH REMOVER from 3M Company.

The transparent protective coating can be applied to the microscope objective by any suitable method, including brush coating, dip coating, spray coating, spin coating, and wipe coating. Preferably, the transparent protective coating is applied to a sufficient portion of the protective barrel that the liquid photoresist will not directly contact the microscope objective when partially submerged in it during use in multiphoton imaging (e.g., two-photon stereolithography).

Semi-submersible microscope objectives can be substituted for conventional microscope objectives used in multiphoton stereolithographic processes known in the art.

In general, liquid photoresists comprise a multiphoton absorbing compound (multiphoton absorber) in combination with at least one polymerizable compound. In multiphoton stereolithographic processes, laser light is directed through the microscope objective (or semi-submersible microscope objective in the case of the present disclosure) and into liquid photoresist in an image-wise manner under conditions such that multiphoton absorption by the multiphoton absorber, and at least partial polymerization of the polymerizable compound occurs resulting in an exposed photoresist. Development of the exposed photoresist, typically with solvent, then reveals a fabricated structure.

Details concerning materials and methods suitable for multiphoton stereolithography using liquid photoresists are described in, for example, U.S. Pat. Appl. Publ. No. 2012/0218535 (Thiel et al.). Typically, liquid photoresists suitable for conventional one-photon stereolithography (an additive manufacturing process which employs a vat of liquid ultraviolet curable photopolymer resin and an ultraviolet laser to build structures by stepwise formation of layers, one on top of another) can be adapted for use as liquid photoresists for multiphoton imaging by replacing the initiator/sensitizer component(s) with ones suitable for multiphoton (e.g., two-photon) imaging. Additional details can be found in the examples included hereinbelow. General information concerning materials and methods for practicing multiphoton stereolithography can be found, for example, in U.S. Pat. No. 7,118,845 (DeVoe et al.).

Advantageously, the semi-submersible microscope objectives of the present disclosure can be used in such processes in place of the conventional microscope objective, thereby offering a degree of safety with respect to accidental adhesion to the photoresist during imaging.

SELECT EMBODIMENTS OF THE PRESENT DISCLOSURE

In a first embodiment, the present disclosure provides a semi-submersible microscope objective comprising:
 a microscope objective comprising:
  a protective barrel having an optical inlet and an optical exit; and at least one optical element disposed within the protective barrel and along an optical path extending between the optical inlet and the optical exit; and
  a protective element affixed to the microscope objective, sealing the optical exit but not the optical inlet, wherein a transparent portion of the protective element is aligned with the optical path, and wherein the protective element is separable from the microscope objective without damaging the microscope objective.

In a second embodiment, the present disclosure provides a semi-submersible microscope objective according to the first embodiment, wherein the protective element mechanically engages the microscope objective.

In a third embodiment, the present disclosure provides a semi-submersible microscope objective according to the second embodiment, further comprising index-matched fluid disposed between the optical exit and the transparent portion of the protective element.

In a fourth embodiment, the present disclosure provides a semi-submersible microscope objective according to the first embodiment, wherein the protective element comprises a transparent protective coating.

In a fifth embodiment, the present disclosure provides a semi-submersible microscope objective according to the fourth embodiment, wherein the transparent protective coating is dissolvable in a water-based solvent.

In a sixth embodiment, the present disclosure provides a semi-submersible microscope objective according to the fourth embodiment, wherein the transparent protective coating is chemically crosslinked.

In a seventh embodiment, the present disclosure provides a semi-submersible microscope objective according to the fourth embodiment, wherein the transparent protective coating comprises at least one of polyvinyl alcohol or a polymer having pendant carboxyl or carboxylate groups.

In an eighth embodiment, the present disclosure provides a semi-submersible microscope objective according to the fourth embodiment, wherein the microscope objective has a numerical aperture of at least 1.0.

In a ninth embodiment, the present disclosure provides a multiphoton imaging method comprising:
immersing a semi-submersible microscope objective in a liquid photoresist comprising a multiphoton absorber and a polymerizable compound, wherein the semi-submersible microscope objective comprises:
  a microscope objective comprising:
    a protective barrel having an optical inlet and an optical exit; and at least one optical element disposed within the protective barrel and along an optical path extending between the optical inlet and the optical exit; and
  a protective element affixed to the microscope objective, sealing the optical exit but not the optical inlet, wherein a transparent portion of the protective element is aligned with the optical path, and wherein the protective element is separable from the microscope objective without damaging the microscope objective;
directing laser light through the semi-submersible microscope objective and into liquid photoresist in an image-wise manner under conditions such that multiphoton absorption by the multiphoton absorber occurs, and at least partial polymerization of the polymerizable compound occurs resulting in an exposed photoresist; and
developing the exposed photoresist.

In a tenth embodiment, the present disclosure provides a multiphoton imaging method according to the ninth embodiment, wherein the protective element mechanically engages the microscope objective.

In an eleventh embodiment, the present disclosure provides a multiphoton imaging method according to the tenth embodiment, further comprising index-matched fluid disposed between the optical exit and the transparent portion of the protective element.

In a twelfth embodiment, the present disclosure provides a multiphoton imaging method according to the ninth embodiment, wherein the protective element comprises a transparent protective coating.

In a thirteenth embodiment, the present disclosure provides a multiphoton imaging method according to the twelfth embodiment, wherein the transparent protective coating is dissolvable in a water-based solvent.

In a fourteenth embodiment, the present disclosure provides a multiphoton imaging method according to the twelfth embodiment, wherein the transparent protective coating is chemically crosslinked.

In a fifteenth embodiment, the present disclosure provides a multiphoton imaging method according to the twelfth embodiment, wherein the transparent protective coating comprises at least one of polyvinyl alcohol or a polymer having pendant carboxyl or carboxylate groups.

In a sixteenth embodiment, the present disclosure provides a multiphoton imaging method according to the twelfth embodiment, wherein the microscope objective has a numerical aperture of at least 1.0.

Objects and advantages of this disclosure are further illustrated by the following non-limiting examples, but the particular materials and amounts thereof recited in these examples, as well as other conditions and details, should not be construed to unduly limit this disclosure.

EXAMPLES

Unless otherwise noted, all parts, percentages, ratios, etc. in the Examples and the rest of the specification are by weight.

Example 1

In this example, a glass microscope cover slip (about 170-190 microns) was glued to a protective element fabricated from Delrin polyoxymethylene that clamped directly to the protective barrel of a Zeiss 40x/1.0 oil iris microscope objective (available from Carl Zeiss Microscopy, LLC, Thornwood, N.Y.) having a tapered end with a centrally disposed lens corresponding to the optical outlet when used for multiphoton imaging, and generally shown in FIG. 1. The protective element is shown in FIGS. 2A-2C. The protective element was then positioned such that the cover slip was in contact with the lens at the optical outlet, and a drop of Zeiss IMMERSOL 518F immersion oil was added between the lens surface and the cover slip to eliminate air.

Figure 4:
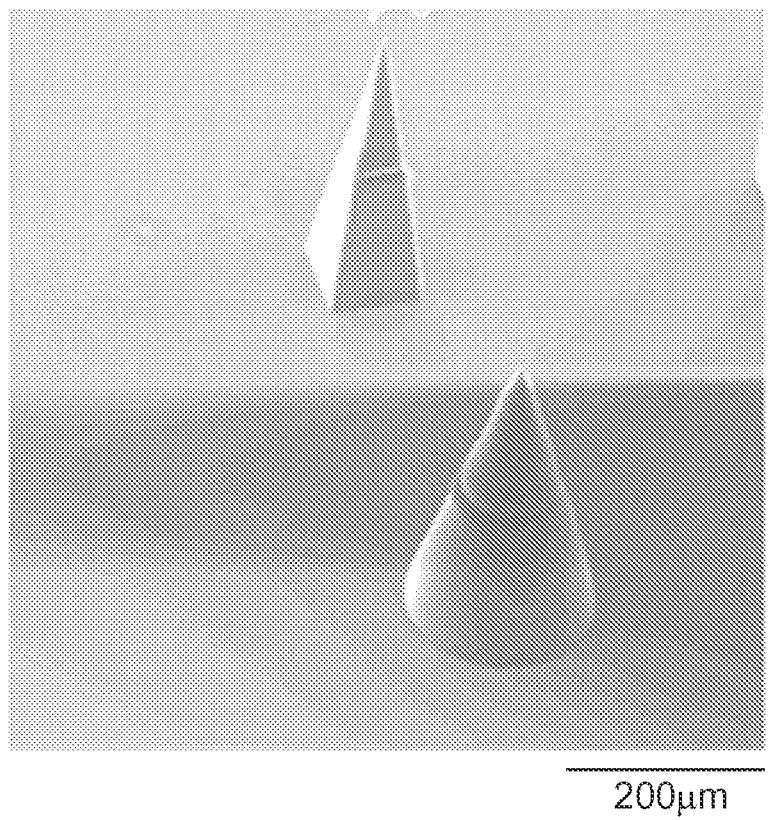
FIG. 4 is a scanning electron microscopy micrograph generated in Example 1.

Several structures were fabricated using the resultant semi-submersible microscope objective using liquid resists of various compositions. FIG. 4 shows a scanning electron microscopy micrograph of some simple geometric structures that were stacked in the z axis, demonstrating the ability to use a lens in liquid resist to write structures taller than the working distance of the semi-submersible microscope objective (resulting in the visible seam halfway up the fabricated structure).

The base of the structure in FIG. 4 was written, and then the top halves were exposed. This sample used 3.5 milliwatts laser power from a Mai Tai ultrafast laser (800 nanometer wavelength, <100 femtosecond pulse length, 80 megahertz repetition rate, available from Spectra-Physics, Santa Clara, Calif.) at the focus. The photoresist composition (which was liquid) was: 65 parts by weight ERL4221 3,4-epoxycyclohexylmethyl 3,4-epoxycyclohexylcarboxylate from Polysciences, Inc., Warrington, Pa.; 35 parts by weight of SR351 trimethylolpropane triacrylate from Sartomer Co., Exton, Pa.; 0.5 part by weight of 2,5-bis[4-(diphenylamino)stryl]-1-(2-ethylhexyloxy)-4-methoxybenzene (KL68) photosensitizer (synthesized as described in U.S. Pat. No. 7,265,161 (Leatherdale et al.)); and 1.0 percent by weight of PC-2506 diaryliodonium hexafluoroantimonate from Polyset Co., Mechanicville, N.Y., and which has the following structure.

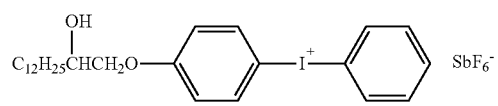

After removal of the protective element, and removal of residual index matching oil, no damage to the microscope objective was evident.

Example 2

An oil immersion microscope objective (40× magnification, NA=1.0, available from Carl Zeiss Microscopy, LLC) was coated with a thin layer of polyvinyl alcohol (PVA). A few drops of a 10 percent by weight solution of PVA in water (6,000 grams/mole, 80% hydrolyzed, Cat. No. 22225 from Polysciences, Inc., Warrington, Pa.) was applied to the exposed lens and surrounding metal on the immersion end of the microscope objective. The microscope objective was manipulated to allow excess solution to run off the final lens surface to provide a suitably thin transparent protective coating. The coated microscope objective was placed in an oven at 50° C. for 2 minutes to facilitate drying.

The coated end of the resultant semi-submersible microscope objective was immersed in a liquid photoresist that had been coated on a silicon substrate. This resist formulation consisted of: 35 parts by weight of EPON 828 bisphenol A diglycidyl ether from Momentive, Houston, Tex.; 30 parts by weight of ERL4221 3,4-epoxycyclohexylmethyl 3,4-epoxycyclohexylcarboxylate from Polysciences, Inc.; and 35 parts by weight of SR351 trimethylolpropane triacrylate for Sartomer Co.; 0.5 part of KL68 photosensitizer used in Example 1, and 1 percent by weight of PC-2506 diaryliodonium hexafluoroantimonate from Polyset Co.

A MaiTai ultrafast laser (800 nanometer wavelength, <100 femtosecond pulse length, 80 megahertz repetition rate, available from Spectra-Physics, Santa Clara, Calif.) was scanned at 10 milliwatts power at the focal point of the objective lens to fabricate structures in the photoresist.

After laser scanning, the liquid photoresist sample on silicon was removed from the system for development. The liquid photoresist remaining on the objective lens was wiped with lens paper wetted with isopropyl alcohol. The lens coating was examined under an optical microscope and further cleaned with ethyl alcohol and lens paper. Finally the PVA transparent protective coating was removed by immersion in deionized water for 2 minutes. No damage to the microscope objective was evident.

Example 3

Example 2 was repeated except that SCOTCHGARD RESILIENT FLOOR PROTECTOR (an aqueous coatable protection product having a solids content of 22 percent by weight, a pH of 7.4-8.4, and a viscosity of less than 8 centipoise) from 3M Company, Maplewood, Minn., was used in place of the polyvinyl alcohol solution. After laser scanning, the resist on the objective lens was wiped with lens paper wetted with isopropyl alcohol, and further cleaned with ethyl alcohol on a lens paper. Finally, the transparent protective coating was removed by immersion in Speed Stripper Concentrate 6H diluted with water for use with approximate volume dilution ratio of 1:16 (from 3M Company) for 2 minutes, rinsed in deionized water, and followed by a final rinsing in ethyl alcohol. No damage to the microscope objective was evident.

Example 4

Example 2 was repeated, except that SCOTCHGARD LOW MAINTENANCE FLOOR FINISH (an aqueous product having a solids content of 25 percent by weight, a pH of 8.1-8.9, and viscosity of less than 10 centipoise) from 3M Company, Saint Paul, Minn., was used in place of the polyvinyl alcohol solution. After laser scanning, the resist on the objective lens was wiped with lens paper wetted with isopropyl alcohol, and further cleaned with ethyl alcohol on a lens paper. Finally, the transparent protective coating was removed by immersion in SPEED STRIPPER CONCENTRATE 6H (from 3M Company) diluted with water for use with approximate volume dilution ratio of 1:16 for 2 minutes, rinsed in deionized water, and followed by a final rinsing in ethyl alcohol. No damage to the microscope objective was evident.

All cited references, patents, or patent applications in the above application for letters patent are herein incorporated by reference in their entirety in a consistent manner. In the event of inconsistencies or contradictions between portions of the incorporated references and this application, the information in the preceding description shall control. The preceding description, given in order to enable one of ordinary skill in the art to practice the claimed disclosure, is not to be construed as limiting the scope of the disclosure, which is defined by the claims and all equivalents thereto.

What is claimed is:

1. A multiphoton imaging method comprising:
   immersing a semi-submersible microscope objective in a liquid photoresist comprising a multiphoton absorber and a polymerizable compound, wherein the semi-submersible microscope objective comprises:
   a microscope objective having a protective barrel with an optical inlet and optical outlet;
   a protective element affixed to the microscope objective, sealing the optical exit but not the optical inlet, wherein a transparent portion of the protective element is aligned with the optical exit, and wherein the protective element is separable from the microscope objective without damaging the microscope objective;
   directing laser light through the semi-submersible microscope objective and into liquid photoresist in an image-wise manner under conditions such that multiphoton absorption by the multiphoton absorber occurs, and at least partial polymerization of the polymerizable compound occurs resulting in an exposed photoresist; and
   developing the exposed photoresist.

2. The multiphoton imaging method of claim 1, wherein the protective element comprises a cap having a central opening and a sleeve extending from one major surface of the cap, wherein the sleeve is adapted to mechanically engage the microscope objective, and wherein the transparent portion comprises a transparent window secured to the cap and covering the central opening.

3. The multiphoton imaging method of claim 2, further comprising index-matched fluid disposed between the optical exit and the transparent portion of the protective element.

4. The multiphoton imaging method of claim 1, wherein the protective element comprises a transparent protective coating.

5. The multiphoton imaging method of claim 4, wherein the transparent protective coating is dissolvable in a water-based solvent.

6. The multiphoton imaging method of claim 4, wherein the transparent protective coating is chemically crosslinked.

7. The multiphoton imaging method of claim 4, wherein the transparent protective coating comprises at least one of polyvinyl alcohol or a polymer having pendant carboxyl or carboxylate groups.

8. The multiphoton imaging method of claim 1, wherein the microscope objective has a numerical aperture of at least 1.0.

* * * * *